US008729602B2

United States Patent
Ishibashi et al.

(10) Patent No.: US 8,729,602 B2
(45) Date of Patent: May 20, 2014

(54) AVALANCHE PHOTODIODE

(75) Inventors: Tadao Ishibashi, Yokohama (JP); Seigo Ando, Yokohama (JP); Masahiro Nada, Atsugi (JP); Yoshifumi Muramoto, Atsugi (JP); Haruki Yokoyama, Atsugi (JP)

(73) Assignees: NTT Electronics Corporation, Kanagawa (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 13/819,279

(22) PCT Filed: Sep. 1, 2011

(86) PCT No.: PCT/JP2011/069866
§ 371 (c)(1),
(2), (4) Date: Feb. 26, 2013

(87) PCT Pub. No.: WO2012/029896
PCT Pub. Date: Mar. 8, 2012

(65) Prior Publication Data
US 2013/0154045 A1 Jun. 20, 2013

(30) Foreign Application Priority Data
Sep. 2, 2010 (JP) .................................. 2010-197155

(51) Int. Cl.
*H01L 31/107* (2006.01)
*H01L 21/00* (2006.01)
(52) U.S. Cl.
USPC ............................................ 257/186; 438/48
(58) Field of Classification Search
USPC .............. 438/48, 91, 380, 983; 257/186, 438, 257/E31.063, E29.18–E29.335
See application file for complete search history.

(56) References Cited

U.S. PATENT DOCUMENTS

| 8,575,650 | B2 * | 11/2013 | Ishibashi et al. | 257/186 |
| 2012/0168720 | A1 * | 7/2012 | Akita et al. | 257/21 |

FOREIGN PATENT DOCUMENTS

| JP | 2005-142455 | 6/2005 |
| JP | 2007-250585 | 9/2007 |

(Continued)

OTHER PUBLICATIONS

International Search Report dated Nov. 1, 2011 for corresponding International Patent Application No. PCT/JP2011/069866 with English translation consisting of 4 pages.

(Continued)

*Primary Examiner* — Calvin Lee
(74) *Attorney, Agent, or Firm* — Ohlandt Greeley Ruggiero & Perle L.L.P.

(57) ABSTRACT

An APD is provided with a semi-insulating substrate, a first mesa having a first laminate constitution in which a p-type electrode layer, a p-type light absorbing layer, a light absorbing layer with a low impurity concentration, a band gap inclined layer, a p-type electric field control layer, an avalanche multiplier layer, an n-type electric field control layer, and an electron transit layer with a low impurity concentration are stacked in this order on a surface of the semi-insulating substrate, a second mesa having an outer circumference provided inside an outer circumference of the first mesa as viewed from the laminating direction and having a second laminate constitution in which an n-type electrode buffer layer and an n-type electrode layer are stacked in this order on a surface on the electron transit layer side of the first mesa, and in the APD, a total donor concentration of the n-type electric field control layer is lower than a total acceptor concentration of the p-type electric field control layer in a range of $2\times10^{11}$ to $1\times10^{12}/cm^2$.

4 Claims, 7 Drawing Sheets

(56) References Cited

FOREIGN PATENT DOCUMENTS

| | | |
|---|---|---|
| JP | 4234116 | 12/2008 |
| JP | 2010-147177 | 7/2010 |
| WO | WO2005/078809 | 8/2005 |

OTHER PUBLICATIONS

Notification Concerning Transmittal of International Preliminary Report on Patentability (Chapter I of the Patent Cooperation Treaty) dated Mar. 14, 2013 for corresponding International Patent Application No. PCT/JP2011/069866 with English translation consisting of 5 pages.

* cited by examiner

AVALANCHE PHOTODIODE

BACKGROUND

1. Field of the Disclosure

The present disclosure relates to a device structure of an avalanche photodiode.

2. Discussion of the Background Art

An avalanche multiplier photodiode (avalanche photodiode: APD) as a highly-sensitive light receiving device has been widely introduced in, for example, an optical communication system using a photocarrier in a long wavelength range (1.5 micron band). A typical APD device operated in the long wavelength range is of a hole-injection type in which InP is an avalanche multiplier layer and usually has a structure in which an avalanche multiplier region is specified by a pn junction formed by Zn thermal diffusion to InP and a guard ring is disposed around the junction surface.

Meanwhile, it is assumed that in terms of rapidity and avalanche excess noise characteristics, an electron-injection type APD in which InAlAs is an avalanche multiplier layer is more advantageous than the hole-injection type APD in which InP is an avalanche multiplier layer. In InAlAs, since the ionization coefficient ratio between the electrons and the holes is larger, avalanche excess noise is low, and, in addition, since a gain-band product (GB product) increases, InAlAs has receiver sensitivity more excellent than that of InP-APD.

However, in an element manufacturing technical standpoint, a so-called "guard ring technique" for suppressing edge breakdown around a junction does not reach completeness in the hole-injection type. One reason for this is that it is difficult to form an "ion-injection type guard ring structure" usually used in the hole-injection type.

Thus, a structure alternative to the ion-injection type guard ring has been proposed. For example, there have been reported a structure (for example, see Non-Patent Documents 1 and 2) that avoids an influence of an edge electric field on an avalanche multiplier layer without forming an intended guard ring and a structure (for example, see Patent Document 1) where an embedded n-electrode having a low concentration is provided in a lower portion of an avalanche multiplier layer.

PRIOR ART DOCUMENTS

Patent Documents

Patent Document 1: Japanese Patent No. 4234116
Patent Document 2: Japanese Patent Application Laid-Open No. 2010-147177

Non-Patent Document

Non-Patent Document 1: E. Yagyu et al., IEEE Photon. Tech. Lett. vol. 18 No. 1, pp. 76-78, 2006.
Non-Patent Document 2: F. Levine et al., IEEE Photon. Tech. Lett. vol. 18, pp. 1898-1900, 2006.

SUMMARY

The Non-Patent Document 2 reports an APD structure of InGaAs/InAlAs, and in this structure, an avalanche multiplier layer is disposed on the n-type substrate side, a depleted InGaAs light absorbing layer is disposed on the p-electrode side of an upper surface, and a wide band gap layer and a p-electrode layer are arranged thereon. Although an edge electric field reflecting the shape of the p-electrode layer is generated in the p-electrode layer, the wide band gap layer, and the InGaAs light absorbing layer, an electric field increase does not reach an avalanche multiplier layer; therefore, the occurrence of edge breakdown can be suppressed. However, since in this structure the InGaAs light absorbing layer is depleted in the operation of applying bias, a certain potential effect remains, and therefore, as a horizontal dimension of a mesa is reduced, a dark current due to an InGaAs lateral surface (front surface) of the mesa tends to increase.

In the Patent Document 1, there is adopted a configuration in which an embedded n-electrode layer is disposed on the substrate side to specify an avalanche region, and in this configuration, since a p-type InGaAs light absorbing layer can be used, the receiver sensitivity is excellent. Recently, the structure of the Patent Document 1 is modified, whereby a method for suppressing an edge electric field more stably has been proposed (for example, see Patent Document 2).

FIG. 6 is a view for explaining an inverted APD structure disclosed in the Patent Document 2. In the inverted APD structure disclosed in the Patent Document 2, p-type InGaAs light absorbing layers (33A and 33B) with a low impurity concentration are arranged on the substrate side, and an "electron transit layer 37B" is provided between an avalanche multiplier layer 36 and an n-type electrode buffer layer 38A, and in this structure, when an internal electric field distribution of APD is "low (light absorbing layer 33B)—high (avalanche multiplier layer 36)—low (electron transit layer 37B)", an edge electric field is generated in the n-type electrode buffer layer 38A and the electron transit layer 37B. Since a band gap of the electron transit layer 37B can be sufficiently made large compared to InGaAs (for example, InP and InAlAs), even if an electric field concentration depending on the shape of the n-type electrode layer 38B occurs, occurrence of breakdown due to the electric field concentration at the electron transit layer 37B is suppressed. At the same time, the electron transit layer 37B is inserted between the n-type electrode layer 38B and the avalanche multiplier layer 36 to be separated at a distance from each other, whereby the edge electric field is not applied to the avalanche multiplier layer 36, and furthermore the edge breakdown of the avalanche multiplier layer 36 can be suppressed.

In general, under circumstances in which the light absorbing layer 33B with a low impurity concentration is depleted (voltage drop occurs), since a side surface of a first mesa 101 is exposed, a dark current derived from a surface of the first mesa 101 easily increases. However, in the disclosure in the Patent Document 2, although in the inverted APD structure the electric field of the electron transit layer 37B is reduced more than in the case of the avalanche multiplier layer 36 to reduce the ionization coefficient ratio of the region, a method of setting the value of the electric field of the electron transit layer 37B to an optimum value and materials and constitutions of the electron transit layer 37B and the n-type electrode buffer layer 38A are not clarified. Thus, in the inverted APD structure disclosed in the Patent Document 2, there are problems that it is difficult to reduce the dark current derived from the mesa surface and a tunnel current of the n-type electrode buffer layer 38A is generated.

Thus, an object of the present disclosure is to provide an APD which can reduce a dark current derived from a mesa surface and a shape of an electrode layer and including a tunnel current.

In order to achieve the above object, an APD according to the present disclosure is invented so that a total donor concentration of an n-type electric field control layer and a total acceptor concentration of a p-type electric field control layer have a predetermined relationship with each other.

Specifically, an APD according to the present disclosure includes: a semi-insulating substrate; a first mesa including a first laminate constitution in which a p-type electrode layer, a p-type light absorbing layer, a light absorbing layer with a low impurity concentration, a band gap inclined layer, a p-type electric field control layer, an avalanche multiplier layer, an n-type electric field control layer, and an electron transit layer with a low impurity concentration are stacked in this order on a surface of the semi-insulating substrate; and a second mesa having an outer circumference provided inside an outer circumference of the first mesa as viewed from the laminating direction and having a second laminate constitution in which an n-type electrode buffer layer and an n-type electrode layer are stacked in this order on a surface on the electron transit layer side of the first mesa, wherein a total donor concentration of the n-type electric field control layer is lower than a total acceptor concentration of the p-type electric field control layer in a range of $2 \times 10^{11}$ to $1 \times 10^{12}/cm^2$.

The total donor concentration of the n-type electric field control layer and the total acceptor concentration of the p-type electric field control layer have a predetermined relationship with each other, whereby when an applied voltage is increased, it is possible to prevent an outer circumference portion of the p-type electric field control layer from being depleted and reduce the dark current. Accordingly, this disclosure can provide an APD which can reduce the dark current derived from a mesa surface and a shape of an electrode layer.

In the APD according to the present disclosure, the donor concentration of the n-type electrode buffer layer is in a range of $2 \times 10^{16}$ to $1 \times 10^{17}/cm^3$. A depletion layer of the n-type electrode buffer layer extends across an outer circumference portion of the second mesa to reduce electric field concentration. Thus, even if a material having a relatively small band gap is used in the n-type electrode buffer layer, the generation of the tunnel current and an avalanche current can be suppressed.

In the APD according to the present disclosure, the outer circumference of the n-type electrode layer is inside an outer circumference of the n-type electrode buffer layer, as viewed from the laminating direction. Since the n-type electrode layer is disposed inside the n-type electrode buffer layer, a depletion region generated in the outer circumference portion of the n-type electrode buffer layer does not extend into the n-type electrode layer. Thus, the concentration of the edge electric field at the time of applying voltage is reduced, and the occurrence of the edge breakdown and the generation of the edge tunnel current can be suppressed.

The present disclosure can provide an APD which can reduce a dark current derived from a mesa surface and a shape of an electrode layer.

DESCRIPTION OF EMBODIMENTS

Figure 1A:
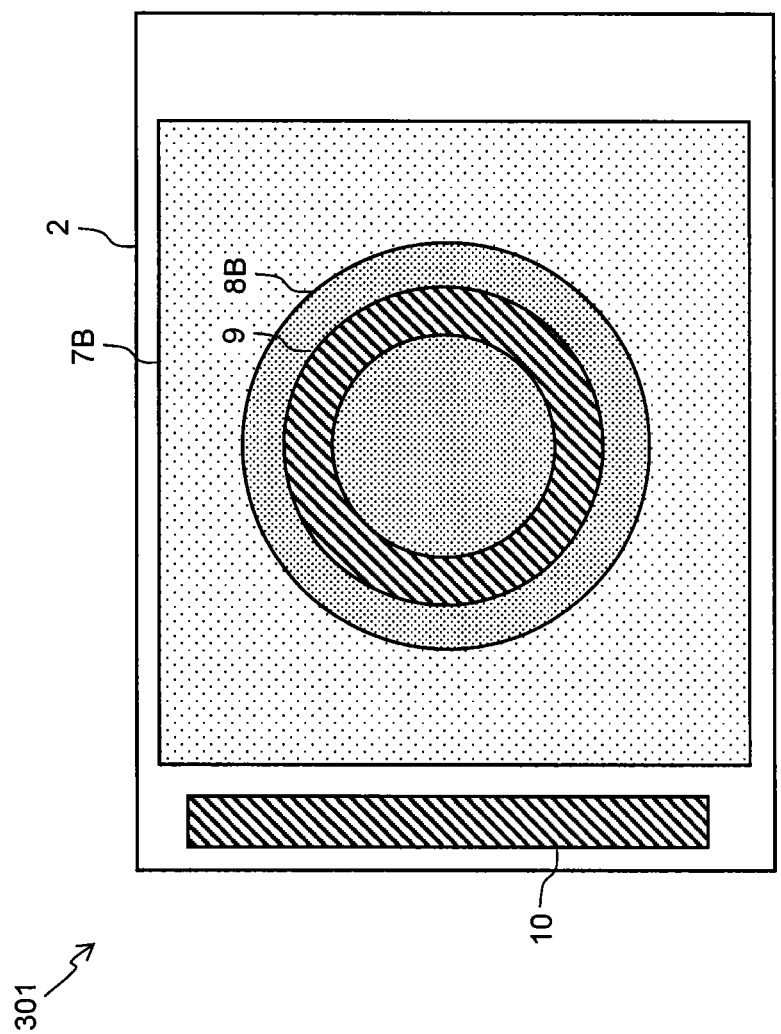
FIG. 1A is an upper view for explaining an APD according to the present disclosure.

Hereinafter, although the present disclosure will be described in detail, specifically showing an embodiment, the present disclosure is not interpreted while limiting to the following description. Components denoted by the same reference numerals in the present specification and the drawings mutually denote the same components.

Detailed Description of the Preferred Embodiment

Figure 1B:
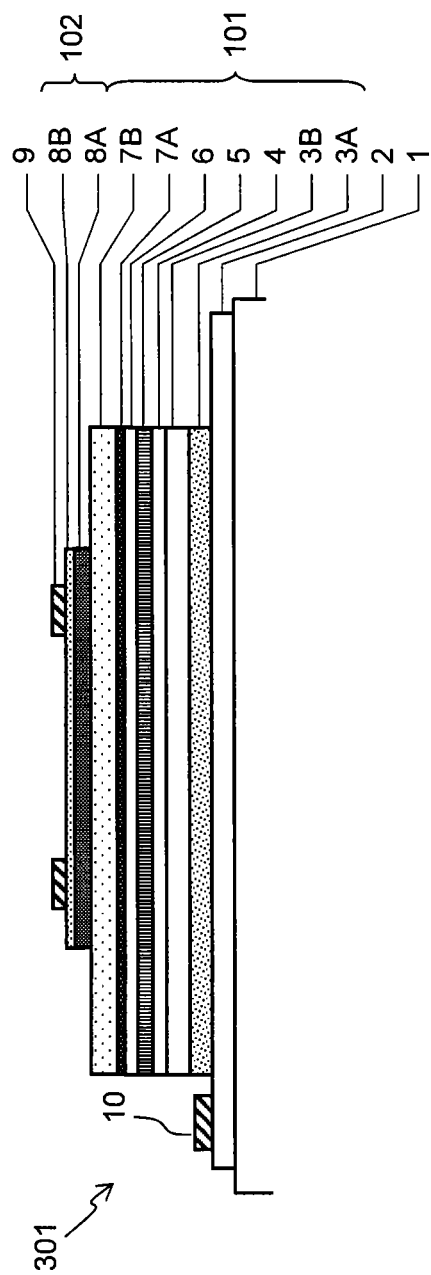
FIG. 1B is a cross-sectional view for explaining an APD according to the present disclosure. disclosure

FIG. 1A is an upper view of an element for explaining an APD 301. FIG. 1B is a cross-sectional view of an element for explaining an APD 301. In description of the present specification, the side of an n-electrode 9 is an upper side and a laminating direction with respect to a semi-insulating substrate 1.

The APD 301 is provided with the semi-insulating substrate 1, a first mesa 101 having a first laminate constitution in which a p-type electrode layer 2, a p-type light absorbing layer 3A, a light absorbing layer 3B with a low impurity concentration, a band gap inclined layer 4, a p-type electric field control layer 5, an avalanche multiplier layer 6, an n-type electric field control layer 7A, and an electron transit layer 7B with a low impurity concentration are stacked in this order on a surface of the semi-insulating substrate 1, and a second mesa 102 having an outer circumference provided inside an outer circumference of the first mesa 101 as viewed from the laminating direction and having a second laminate constitution in which an n-type electrode buffer layer 8A and an n-type electrode layer 8B are stacked in this order on a surface on the electron transit layer 7B side of the first mesa 101, and in the APD, the total donor concentration of the n-type electric field control layer 7A is lower than the total acceptor concentration of the p-type electric field control layer 5 in a range of $2 \times 10^{11}$ to $1 \times 10^{12}/cm^2$. The APD 301 is further provided with the n-electrode 9 having a ring shape and provided on the n-type electrode layer 8B and a p-electrode 10 provided on the p-type electrode layer 2 at a portion different from the first mesa 101. The APD 301 is an electron-injection type APD element.

For example, the semi-insulating substrate 1 is InP, the p-type electrode layer 2 is p-InAlGaAs, the p-type light absorbing layer 3A is p-type doped InGaAs, the light absorbing layer 3B is InGaAs, the band gap inclined layer 4 is InAlGaAs in which the band gap gradually extends in the laminating direction (upper direction), the p-type electric field control layer 5 is p-InAlAs, the avalanche multiplier layer 6 is InAlAs, the n-type electric field control layer 7A is n-InAlAs, the electron transit layer 7B is InP with a low impurity concentration, the n-type electrode buffer layer 8A is InGaAsP, and the n-type electrode layer 8B is InGaAsP. The band gap energy of InGaAsP used in the n-type electrode buffer layer 8A and the n-type electrode layer 8B is 1 eV for the sake of ease of selective etching, as will be described later.

To fabricate the APD 301, for example, layers from the p-type electrode layer 2 to the n-type electrode layer 8B are epitaxially grown in sequence on the semi-insulating substrate 1 by using an MO-VPE method and so on. Subsequently, mesa processing is applied to each epitaxially grown layer, and the first mesa 101 and the second mesa 102 are formed. The mesa processing is similar to the fabrication process of a usual mesa-type APD. For example, the second mesa 102 having a cylindrical shape is formed from the n-type electrode layer 8B and the n-type electrode buffer layer 8A in sequence from the top, using chemical etching. Then, the electron transit layer 7B and the lower portion are subjected to mesa processing in sequence to form the first mesa 101 having a rectangular shape. After that, the n-electrode 9 and the p-electrode 10 are formed, and wiring and element isolation are performed according to need.

Figure 2:
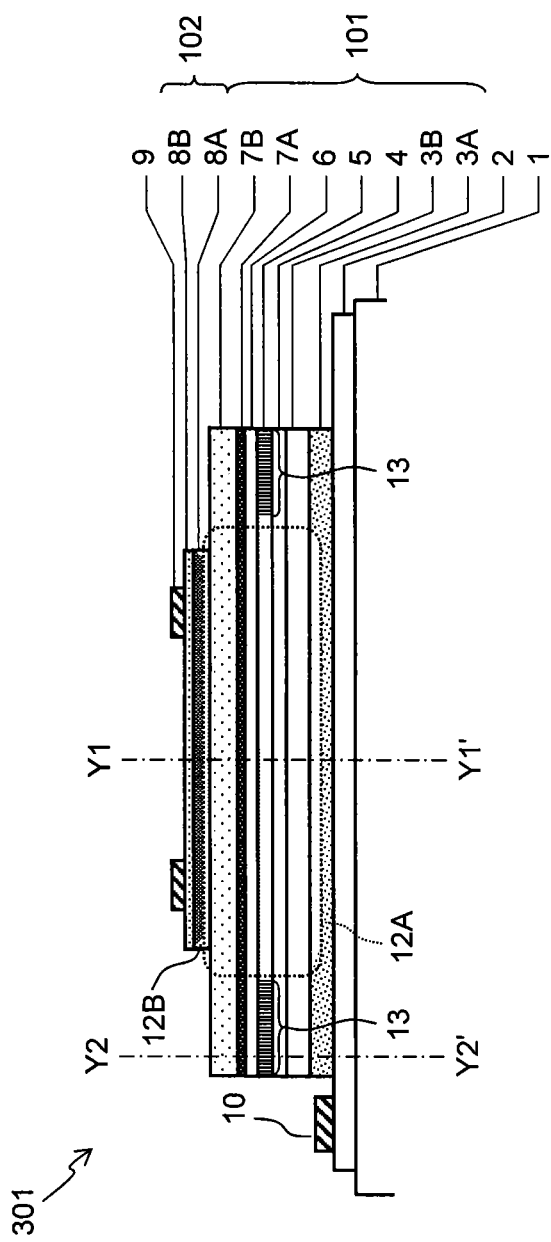
FIG. 2 is a view for explaining the APD according to the present disclosure.

FIG. 2 is a view for explaining a state of depletion in a device structure in an operating state in which bias is applied to the APD 301. In each layer, in an operating state in which voltage is applied, the doping concentration is adjusted so that a portion shown by a dashed portion 12A (a portion on the n-type electrode layer 8B side of the p-type light absorbing layer 3A to a portion on the semi-insulating substrate 1 side of the light absorbing layer 3B, the band gap inclined layer 4, the p-type electric field control layer 5, the avalanche multiplier layer 6, the n-type electric field control layer 7A, the electron transit layer 7B, and the n-type electrode buffer layer 8A) is depleted. Thus, when a sufficient voltage is applied between the n-electrode 9 and the p-electrode 10, the p-type electric field control layer 5 and the n-type electric field control layer 7A of the first mesa 101 are depleted, and a lower portion of the second mesa 102 (a portion of the n-type electrode layer 8B) is a depletion region 12B.

Figure 3:
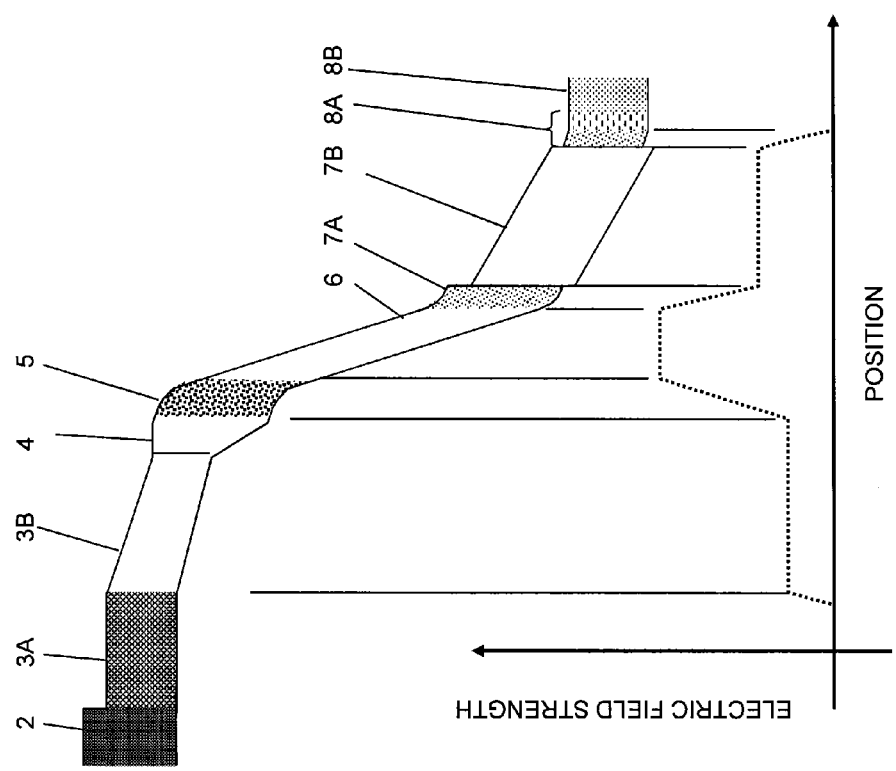
FIG. 3 is a band diagram for explaining the APD according to the present disclosure.

The total donor concentration of the n-type electric field control layer 7A is adjusted relatively lower than the total acceptor concentration of the p-type electric field control layer 5 in a range of $2\times10^{11}$ to $1\times10^{12}/cm^2$. As the bias voltage is increased, the depletion of the n-type electric field control layer 7A and the p-type electric field control layer 5 is initially advanced over the entire first mesa 101. The total donor concentration of the n-type electric field control layer 7A is relatively small, and therefore, once all the donors of the n-type electric field control layer 7A are ionized, the depletion extends on the n-type electrode layer 8B side, and when voltage is further increased, the p-type electric field control layer 5 is depleted, and an active part of the device is in a state of a band diagram and an electric field profile schematically shown in FIG. 3 (Y1-Y1' cross section of FIG. 2).

In the electric fields of layers on both sides of the avalanche multiplier layer 6, a level difference is formed according to a difference between the total donor concentration of the n-type electric field control layer 7A and the total acceptor concentration of the p-type electric field control layer 5. For example, when the total donor concentration of the n-type electric field control layer 7A is set to a value lower by $5\times10^{11}/cm^2$ than the total acceptor concentration of the p-type electric field control layer 5, the level difference between the electric field strength is approximately 70 kV/cm.

Figure 4:
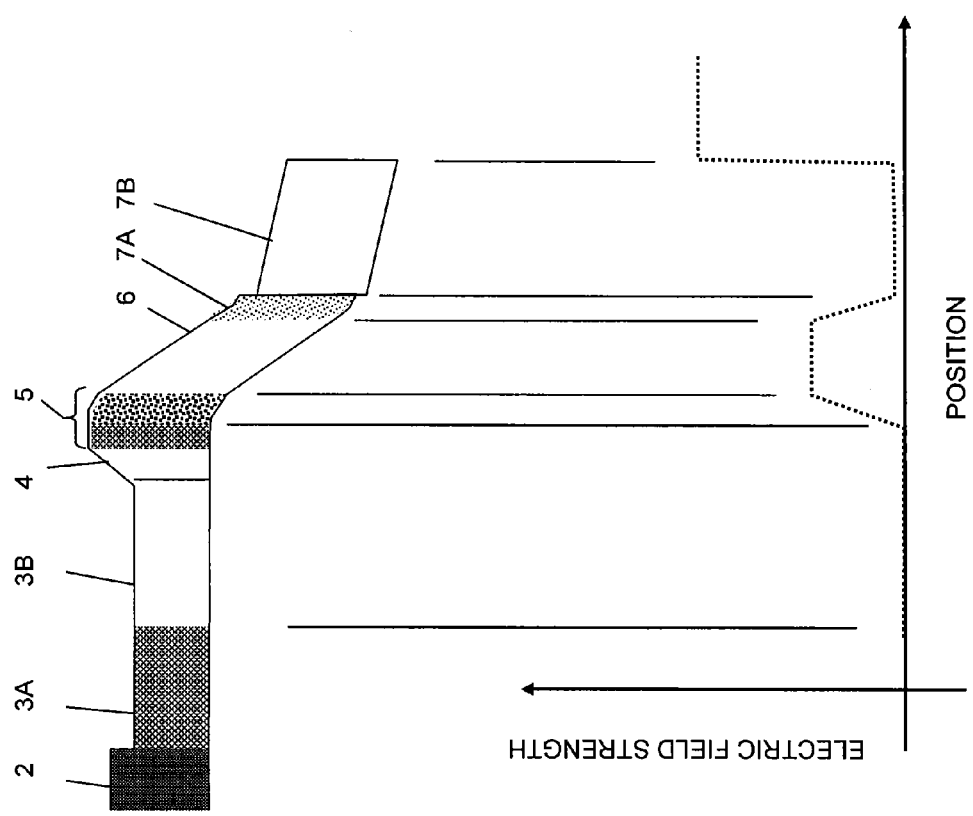
FIG. 4 is a band diagram for explaining the APD according to the present disclosure.

Meanwhile, in the peripheral portion (fringe portion) of the first mesa 101 where the second mesa 102 is not disposed, once the n-type electric field control layer 7A is depleted upon voltage application, the depletion of the p-type electric field control layer 5 is less advanced. This is because the advance of the depletion of the p-type electric field control layer 5 is governed by a fringe capacitance determined by the arrangement of the fringe portion of the first mesa 101 and the second mesa 102. Consequently, the p-type electric field control layer 5 is partially depleted as shown in FIG. 2, and holes remain at other portion shown by reference numeral 13. The states of the band diagram and the electric field profile in this state (Y2-Y2' cross section of FIG. 2) are schematically shown in FIG. 4. Since the p-type light absorbing layer 3A side of the p-type electric field control layer 5 maintains neutrality, the electric potential is the same as that of the light absorbing layers (3A and 3B), and it is brought into a state in which voltage is not applied to the light absorbing layers (3A and 3B). Consequently, a potential change of the surfaces of the light absorbing layers (3A and 3B) of a side surface of the first mesa 101 does not occur, and although diffusion current components of minority carrier remain, the dark current can be significantly reduced.

In the present embodiment, although the total donor concentration of the n-type electric field control layer 7A is adjusted relatively lower than the total acceptor concentration of the p-type electric field control layer 5 in a range of $2\times10^{11}$ to $1\times10^{12}/cm^2$, the reason for setting the numerical range is as follows.

A lower limit ($2\times10^{11}$) of a concentration difference is basically based on a condition in which a p-type neutral layer stably remains (=holes exist) in the portion 13 of FIG. 2. Usually, a bulk acceptor concentration of the p-type electric field control layer 5 is always set to approximately $2\times10^{17}$ to $8\times10^{17}/cm^3$ in consideration of ease of doping control. In a degree of spatial blur of the holes in the p-type neutral layer in the above concentration, a Debye screening length can be used as a guide and is approximately 100 A to 50 A (A is angstrom). A sheet acceptor concentration corresponding to the thickness of 100 A to 50 A is calculated as $2\times10^{11}$ to $4\times10^{11}/cm^2$. Namely, a required minimum concentration difference can be estimated as $2\times10^{11}/cm^2$.

Although several factors are responsible for the upper limit of the concentration difference, the tunnel current in the n-type electrode buffer layer 8A is required to be suppressed. Namely, even if the electric field concentration extending into the n-type electrode buffer layer 8A is best set, in at least an active portion shown by the depletion region 12A the electric field in InGaAsP is required not to exceed a threshold value of tunnel current generation.

In electric field profile design of a usual avalanche photodiode, the electric field of the light absorbing layer (3B) in a maximum operating voltage is set to around 150 kV/cm. In such a situation, at an interface between the electron transit layer 7B and the n-type electrode buffer layer 8A, the electric field corresponding to the above concentration difference is added to 150 kV/cm. If the electron transit layer 7B has a uniform electric field profile, the threshold value of the tunnel current generation of InGaAsP of 1 eV is about 300 kV/cm, and therefore, even if the reduction degree of the total donor concentration of the n-type electric field control layer 7A is added, the value is required not to exceed 300 kV/cm. As a result, the upper limit of the concentration difference at the time when the total donor concentration of the n-type electric field control layer 7A giving an electric field difference of 300−150=150 kV/cm is reduced is calculated as about $1\times10^{12}/cm^2$.

The donor concentration of the n-type electrode buffer layer 8A is adjusted in a range of $2\times10^{16}$ to $1\times10^{17}/cm^3$. When the donor concentration is adjusted in this range, the depletion region of the n-type electrode buffer layer 8A falls between approximately 0.1 and 0.2 μm in the laminating direction. The magnitude of the concentration of the n-type electrode buffer layer 8A does not significantly affect the depleted state of the p-type electric field control layer 5. This is because the fringe capacitance previously described does not increase.

When the donor concentration of the n-type electrode buffer layer 8A is set in the above range, such an effect that "processing accuracy of a mesa is enhanced, and stable device fabrication is realized" can be obtained. The reason is as follows. When the donor concentration of the n-type electrode buffer layer 8A is set in the above range, the depletion of the fringe of the n-type electrode buffer layer 8A extends in the portion 12 of FIG. 2. Consequently, the edge electric field concentration is reduced, and even if an InGaAsP material with a small band gap which facilitates selective etching to InP is used in the n-type electrode buffer layer 8A, the generation of the tunnel current and the avalanche current can be suppressed.

Namely, when the donor concentration of the n-type electrode buffer layer 8A is set in the above range, not a material having a large band gap difference with respect to the electron transit layer 7B but a material having a large chemical etching selectivity with respect to the electron transit layer 7B can be used as the material of the n-type electrode buffer layer 8A. For example, in the case of the APD 301, InGaAsP having a small band gap difference with respect to InP of the electron transit layer 7B and having a large chemical etching selectivity is used in the n-type electrode buffer layer 8A. Thus, in the APD 301, the processing accuracy of the second mesa 102 is enhanced, and a stable device fabrication is realized.

Second Embodiment

Figure 5:
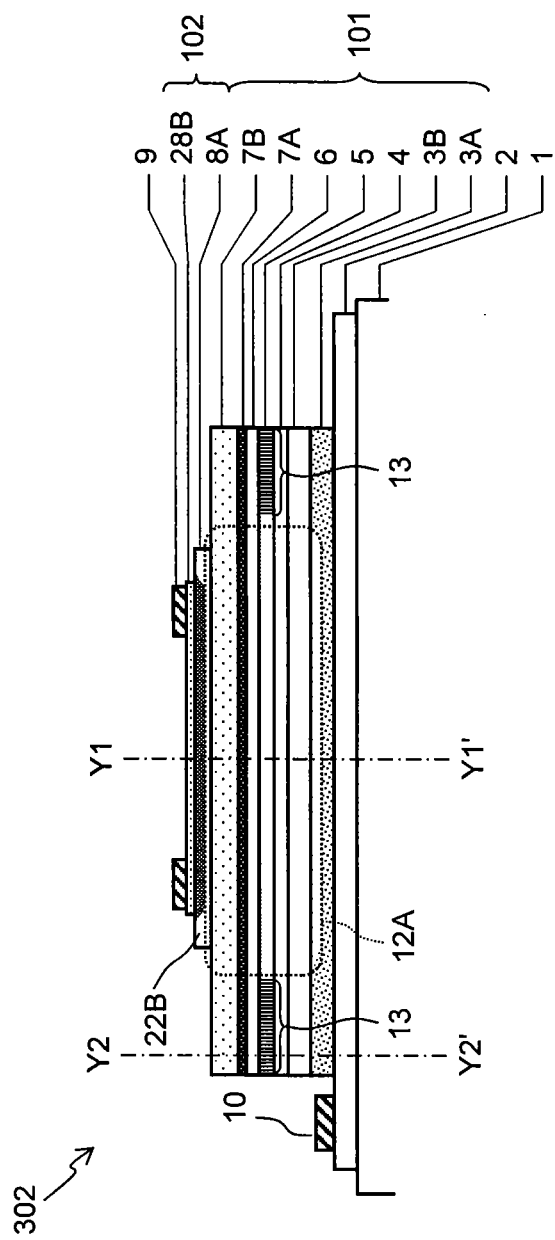
FIG. 5 is a view for explaining the APD according to the present disclosure.
Figure 6:
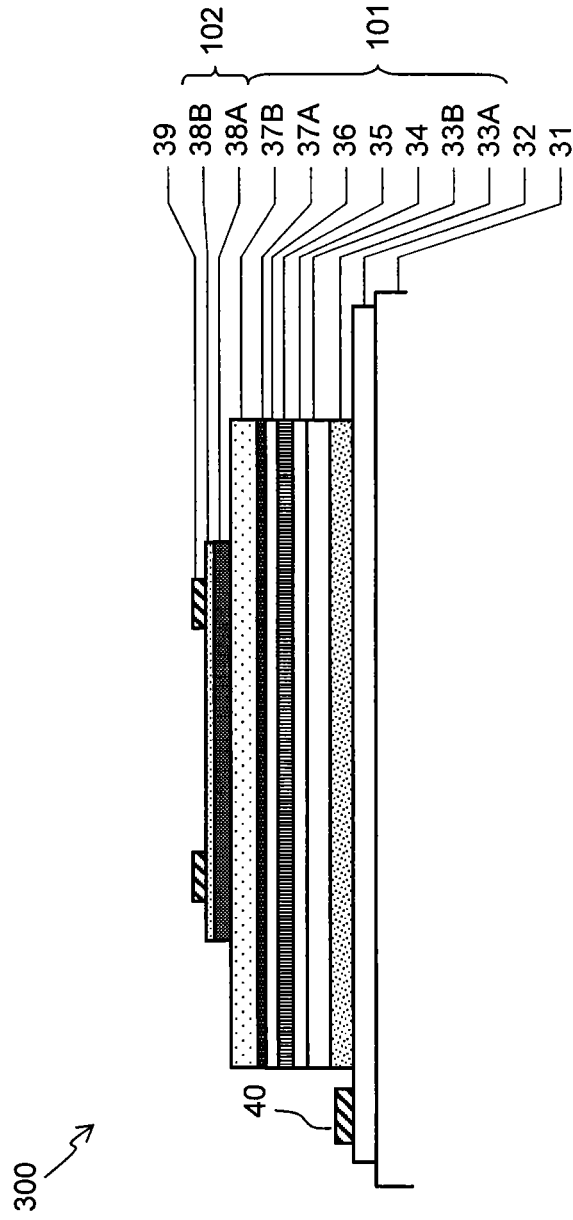
FIG. 6 is a view for explaining a conventional APD.

FIG. 5 is a schematic diagram (cross-sectional view) of an element for explaining an APD 302. The APD 302 is different from the APD 301 of FIGS. 1 and 2 in that the APD 302 is provided with an n-type electrode layer 28B instead of the n-type electrode layer 8B. The n-type electrode layer 28B has a shape different from the shape of the n-type electrode layer 8B. Namely, an outer circumference of the n-type electrode layer 28B is inside an outer circumference of an n-type electrode buffer layer 8A, as viewed from the laminating direction.

Although the fabrication of the APD 302 is similar to that of the APD 301, the APD 302 is fabricated while changing each dimension of the mesa of the n-type electrode layer 28B and the mesa of the n-type electrode buffer layer 8A. Namely, chemical etching of the n-type electrode layer 28B is first performed, and the composition of the n-type electrode layer 28B is changed so that the etching rate of the n-type electrode buffer layer 8A is slowed. For example, when the band gap of the n-type electrode buffer layer 8A is 1.2 eV and the band gap of the n-type electrode layer 28B is 0.9 eV, a sufficient etching selectivity is secured. The selective chemical etching is applied to the n-type electrode layer 28B, whereby the n-type electrode layer 28B can be disposed inside the n-type electrode buffer layer 8A with high accuracy. A procedure for forming a first mesa 101 is similar to the case of the APD 301.

Reference numeral 22B of FIG. 5 is a depletion region generated in the fringe portion of the n-type electrode buffer layer 8A. In the APD 302, since the n-type electrode layer 28B is disposed sufficiently inside the n-type electrode buffer layer 8A, the depletion region 22B does not extend into the n-type electrode layer 28B. Thus, the concentration of the edge electric field at the time of applying voltage is reduced, and the occurrence of the edge breakdown and the generation of the edge tunnel current can be suppressed. Although the shape of the depletion of the n-type electrode buffer layer 8A changes, there is no significant change in the state of the depletion of the p-type electric field control layer 5. Accordingly, as in the APD 301, the side of the light absorbing layers (3A and 3B) of the p-type electric field control layer 5 can maintain the neutral state, and it is possible to maintain a state in which no voltage is applied to the light absorbing layers (3A and 3B).

Accordingly, in the APD 302, a potential change of the surfaces of the light absorbing layers (3A and 3B) of the side surface of the first mesa 101 does not occur, and although diffusion current components of minority carrier remain, the dark current can be significantly reduced.

In the embodiments 1 and 2, although the example of the APD (301 and 302) in which InAlAs is an avalanche multiplier layer and InGaAs is a light absorbing layer has been described, the kind of the semiconductor material is not limited. The structure described in the APD (301 and 302) can be similarly applied to an APD element formed by a combination of other semiconductor materials.

Explanation of Reference Signs

1, 31: semi-insulating substrate
2, 32: p-type electrode layer
3A, 33A: p-type light absorbing layer
3B, 33B: light absorbing layer
4, 34: band gap inclined layer
5, 35: p-type electric field control layer
6, 36: avalanche multiplier layer
7A, 37A: n-type electric field control layer
7B, 37B: electron transit layer
8A, 38A: n-type electrode buffer layer
8B, 28B, 38B: n-type electrode layer
9, 39: n-electrode
10, 40: p-electrode
12A, 12B, 22B: depletion region
13: portion where holes remain
101: first mesa
102: second mesa
300, 301, 302: APD

The invention claimed is:

1. An avalanche photodiode comprising:
   a semi-insulating substrate;
   a first mesa comprising a first laminate constitution in which a p-type electrode layer, a p-type light absorbing layer, a light absorbing layer with a low impurity concentration, a band gap inclined layer, a p-type electric field control layer, an avalanche multiplier layer, an n-type electric field control layer, and an electron transit layer with a low impurity concentration are stacked in this order on a surface of the semi-insulating substrate; and
   a second mesa having an outer circumference provided inside an outer circumference of the first mesa as viewed from the laminating direction and having a second laminate constitution in which an n-type electrode buffer layer and an n-type electrode layer are stacked in this order on a surface on the electron transit layer side of the first mesa,
   wherein a total donor concentration of the n-type electric field control layer is lower than a total acceptor concentration of the p-type electric field control layer in a range of $2 \times 10^{11}$ to $1 \times 10^{12}/cm^2$.

2. The avalanche photodiode according to claim 1, wherein a donor concentration of the n-type electrode buffer layer is in a range of $2 \times 10^{16}$ to $1 \times 10^{17}/cm^3$.

3. The avalanche photodiode according to claim 1, wherein an outer circumference of the n-type electrode layer is inside an outer circumference of the n-type electrode buffer layer, as viewed from the laminating direction.

4. The avalanche photodiode according to claim 2, wherein an outer circumference of the n-type electrode layer is inside an outer circumference of the n-type electrode buffer layer, as viewed from the laminating direction.

* * * * *